United States Patent [19]

Mueller-Hess et al.

[11] Patent Number: 5,187,040
[45] Date of Patent: Feb. 16, 1993

[54] PHOTOCURABLE MIXTURE AND MATERIAL CONTAINING DIAZONIUM SALT POLYCONDENSATION PRODUCT OR ORGANIC AZIDO COMPOUND PHOTOSENSITIZER AND POLYURETHANE BINDER GRAFTED WITH VINYL ALCOHOL AND VINYL ACETAL UNITS

[75] Inventors: Waltraud Mueller-Hess, Wiesbaden; Dieter Mohr, Budenheim; Matthias Kroggel; Karl-Josef Rauterkus, both of Kelkheim, all of Fed. Rep. of Germany

[73] Assignee: Hoechst Aktiengesellschaft, Frankfurt am Main, Fed. Rep. of Germany

[21] Appl. No.: 541,791

[22] Filed: Jun. 21, 1990

[30] Foreign Application Priority Data

Jun. 21, 1989 [DE] Fed. Rep. of Germany ....... 3920230

[51] Int. Cl.$^5$ ...................... G03F 7/012; G03F 7/021
[52] U.S. Cl. .................................... 430/157; 430/175; 430/176; 430/197; 430/284; 430/906; 430/909
[58] Field of Search ............... 430/175, 176, 197, 284, 430/906, 157, 909

[56] References Cited

U.S. PATENT DOCUMENTS

| | | |
|---|---|---|
| 3,660,097 | 5/1972 | Mainthia . |
| 3,867,147 | 2/1975 | Teuscher . |
| 4,186,017 | 1/1980 | Palmer .................. 430/162 |
| 4,337,307 | 6/1982 | Neubauer ................ 430/157 |
| 4,387,151 | 6/1983 | Bosse et al. ............ 430/175 |
| 4,526,854 | 7/1985 | Watanabe et al. ........ 430/175 |
| 4,631,245 | 12/1986 | Pawlowski .............. 430/175 |

FOREIGN PATENT DOCUMENTS 1172492  8/1984  Canada .
1474073  5/1977  United Kingdom .

Primary Examiner—Charles L. Bowers, Jr.
Assistant Examiner—Christopher G. Young
Attorney, Agent, or Firm—Foley & Lardner

[57] ABSTRACT

A photocurable mixture is disclosed that contains a diazonium salt polycondensation product or an organic azido compound as the photosensitive compound and a high-molecular weight polymer as the binder, the polymer being a graft copolymer with a polyurethane as the graft backbone, onto which chains containing vinyl alcohol units are grafted. The mixture is suitable for use in the production of printing plates and photoresists, which can be developed with aqueous solutions. It yields printing plates having a good ink acceptance and long shelf life that produce large print runs.

16 Claims, No Drawings

PHOTOCURABLE MIXTURE AND MATERIAL CONTAINING DIAZONIUM SALT POLYCONDENSATION PRODUCT OR ORGANIC AZIDO COMPOUND PHOTOSENSITIZER AND POLYURETHANE BINDER GRAFTED WITH VINYL ALCOHOL AND VINYL ACETAL UNITS

BACKGROUND OF THE INVENTION

The present invention relates to a photocurable mixture which comprises a diazonium salt polycondensation product or an organic azido compound as a photosensitive compound, and a polymeric binder, and which is especially suitable for the production of printing plates and photoresists.

DE 20 24 244 (=U.S. Pat. No. 3,867,147) discloses photosensitive recording materials comprising cocondensation products of diazonium salts capable of condensation and other, non-photosensitive compounds, capable of condensation, if appropriate combined with polymeric binders, for producing printing plates. These photosensitive materials are distinguished by their high photosensitivity and long print runs. The number of prints obtained is particularly high if water-insoluble binders, for example, polyvinyl formal, are used, but such layers can only be properly processe by means of developers containing a considerable amount of volatile organic solvents. For ecological reasons it is desirable to develop printing plates of this type with purely aqueous solutions. In the most favorable cases, the mentioned printing plates can be developed with relatively aggressive acidic or alkaline purely aqueous solutions by suspending the non-image areas of the layer in the developer, in the form of flakes or relatively small particles. There is, however, the danger of uncontrolled redeposition of flaky matter in non-image areas of the plates whereby the plates are rendered unusable. DE 31 30 987 describes similar mixtures which contain styrene/maleic acid anhydride copolymers as the binders and which can be developed with purely aqueous alkaline solutions. The printing plates obtained using these mixtures, however, yield print runs which are inferior to those of printing plates containing binders which are insoluble in aqueous-alkaline solutions.

DE 30 36 077 (=U.S. Pat. No. 4,387,151) discloses corresponding mixtures which contain binders comprising polymers with alkenylsulfonylurethane side groups. Layers prepared from these mixtures can also be developed by means of purely aqueous solutions. However, when the mixtures are processed to form lithographic printing plates, they yield light-cured coatings whose ink acceptance is unsatisfactory.

DE 24 29 251 discloses a mixture comprising a photosensitive diazo compound and a binder, the binder being obtained by reacting a polymer containing hydroxyl groups or carboxyl groups with a crosslinking agent containing isocyanate groups, epoxide groups or acid anhydride groups. By the crosslinking reaction the solubility of the polymer is reduced. Where these mixtures give materials of high print runs, development cannot be performed without an addition of organic solvents. Products crosslinked to a lesser extent often contain unreacted crosslinking groups and hence have a limited shelf life.

EP 152,819 discloses photosensitive mixtures comprised of diazonium salt polycondensation products and binders containing carboxyl groups, which are obtained by reacting hydroxyl group-containing polymers with acid anhydrides. Plates produced using these mixtures can be developed with aqueous-alkaline solutions, and the mixtures are suited for the production of lithographic printing forms giving high print runs. It is, however, desirable to achieve even better print runs. For this purpose, the publication proposes the addition of minor amounts of other polymers, for example, polyurethanes, in order to increase the abrasion resistance. However, this combination results in a poorer copying performance, such as undesired dot gain. Furthermore, the developing behavior and shelf life of the plates are impaired. Like other mixtures prepared with carboxyl-containing binders, these mixtures also suffer from the draw-back that upon. being processed with developers based on tap water there is the risk of the formation of precipitates in the form of sparingly soluble calcium salts, which are deposited developing machines and cause disturbances.

Mixtures of the above generic type, where polyurethanes are employed as polymeric binders, are known from U.S. Pat. No. 3,660,097 and DE 27 39 774. It is a disadvantage of these mixtures that the binders are sparingly soluble in the solvents conventionally used for coatings and that the solutions have to be filtered several times to remove insoluble residues. The developability of these mixtures in aqueous-alkaline media is very limited and the print runs are inadequate for high-performance machines A similar mixture is known from EP 30,001. The binder contained therein is a branched polyurethane. Using this mixture, relatively high print runs can be achieved, but there are still a number of drawbacks For example, acidic aqueous developer solutions with an addition of organic solvents are preferably employed for achieving a scum-free, rapid development of the photocured layer. When used for automatic processing, these developers may cause corrosion problems at the light metal parts of the processing equipment In DE 37 32 089 graft polymers are described, which comprise a polyurethane as the graft backbone and grafted-on vinyl ester units, which are at least partially saponified to give vinyl alcohol units The polymers are suitable as binders for pigments; for preparing printing inks, thermoplastic adhesives and solvent-containing adhesives; as constituents of varnishes or coatings for fibers, films and metals, and for thermoplastic shaped articles.

JP 246,047/87 describes photopolymerizable mixtures wherein graft polymers of polyurethanes and polyvinyl alcohol with mercapto groups are contained as binders.

Graft polymers obtained from the graft polymers mentioned above by acetalizing with aldehydes, are described in German Patent Application P 38 35 840.9.

German Patent Application P 38 24 146.3 discloses photocurable elastomeric mixtures which contain a compound polymerizable by a free-radical process, a photoinitiator and, as the binder, a graft polymer according to DE 37 32 089, which is soluble or dispersible in an aqueous solution

SUMMARY OF THE INVENTION

It is an object of the present invention to provide a negative-working photosensitive mixture suitable for use in the production of printing plates, particularly lithographic printing plates which has all the advantages of the known compositions based on diazonium salt polycondensation products or azido compounds, can be developed by means of virtually solvent-free, neutral or alkaline aqueous solutions, without resulting in disturbing deposits when developer solutions containing tap water are employed and, at the same time, yields printing plates producing high print runs and having a good ink acceptance and long shelf life, properties which could up to now only be achieved with printing plates requiring the addition of relatively large amounts of organic solvents in the developing process.

These and other objects according to the invention are provided by a photocurable mixture, comprising a photosensitive compound selected from the group consisting of a diazonium salt polycondensation product and an organic azido compound; and a binder comprising a high-molecular weight polymer having vinyl alcohol units, wherein said polymer is a graft polymer comprising a polyurethane graft backbone onto which chains containing vinyl alcohol units are grafted. A photocurable recording material comprising a layer support and a photosensitive layer comprising this mixture is also provided.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

In accordance with the present invention, a photocurable mixture is proposed, which contains a diazonium salt polycondensation product or an organic azido compound as the photosensitive compound, and a high-molecular polymer having vinyl alcohol units as the binder.

The mixture of the invention is characterized in that the polymer is a graft polymer obtained from a polyurethane graft backbone, onto which chains containing vinyl alcohol units are grafted.

In accordance with the present invention, a photocurable recording material is also proposed, comprising a layer support and a photosensitive layer comprising the photocurable mixture.

The graft polymers contained in the mixture of the instant invention are described in DE 37 32 089 and in German Patent Application P 38 35 840.9. To prepare them, a carboxylic acid vinyl ester, and optionally another ethylenically-unsaturated compound copolymerizable therewith, is grafted onto a polyurethane graft backbone and completely or partially saponified The polymers having vinyl alcohol units which are obtained in this way can be further reacted with aldehydes to give polyvinyl acetals.

The proportion of the grafted-on components is in general about 10 to 95, preferably about 30 to 90, and in particular about 40 to 80, % by weight, based on the total graft polymer.

The graft backbone consists of polyurethanes having at least two urethane groups in the molecule, the number of urethane groups per molecule being subject to no particular upper limit and in general having values higher than 2.

The polyurethanes employed as graft backbone can be produced from diols and diisocyanates by conventional processes of polyurethane synthesis. In principle, all of the diols customarily used in polyurethane synthesis can be employed. Cycloaliphatic diols, such as cyclohexanediols, and in particular aliphatic diols having 2 to 12 carbon atoms are preferred. Polyetherdiols, for example polypropylene oxides, polybutylene oxides and copolymers of ethylene oxide, propylene oxide and butylene oxide, preferably the block copolymers thereof, are also preferred; polyethylene oxides with molecular weights of between 200 and 10,000, and more preferably of between 400 and 1,500 are particularly preferred. The polyetherdiols are advantageously employed in combination with low-molecular aliphatic diols, for example 1,4-butanediol, 1,3-propanediol, ethylene glycol, diethylene glycol, 1,2-hexanediol, 1,2-propanediol, pentanediol or cyclohexanediol. The molar ratio of polyetherdiol to low-molecular aliphatic diol is preferably from about 1:0.1 to 1:0.7.

Diisocyanate components which can be employed are aromatic diisocyanates. Aliphatic and/or cycloaliphatic diisocyanates are preferred. Preferred aliphatic diisocyanates are those having 2 to 12 carbon atoms in the aliphatic radical, for example, ethylene diisocyanate, propylene diisocyanate, tetramethylene diisocyanate and 2,2,4-trimethylhexamethylene diisocyanate. Preferred cycloaliphatic diisocyanates are, for example, 1,4-diisocyanato-cyclohexane, dicyclohexylmethane-4,4'-diisocyanate and isophorone diisocyanate. Hexamethylene diisocyanate and isophorone diisocyanate are particularly preferred.

The molar ratio of diol diisocyanate component is preferably between about 1:0.99 and 1:0.5, in particular between about 1:0.98 and 1:0.7. The average molecular weights of the polyurethanes are preferably between about 200 and 100,000, in particular between about 1,000 and 50,000, and more particularly between about 3,000 and 25,000.

Carboxylic acid vinyl esters having about 3 to 20 and preferably about 4 to 14 carbon atoms are employed for grafting onto the polyurethane. Vinyl acetate and/or vinyl propionate, in particular vinyl acetate, are preferred mixtures of vinyl acetate and/or vinyl propionate and vinyl versatate are also preferred. In particular in the case of partial or complete saponification of the products following the graft polymerization, the co-use of vinyl propionate in addition to vinyl acetate during grafting is advantageous. Moreover, copolymerizable mixtures of carboxylic acid vinyl esters can be grafted, preferably mixtures of vinyl acetate and minor amounts of vinyl versatate.

Grafting with different carboxylic acid vinyl esters in the form of block copolymers, optionally in combination with further ethylenically-unsaturated and copolymerizable monomers, can also be advantageous. Furthermore, the carboxylic acid vinyl esters can also be grafted together with other ethylenically-unsaturated and copolymerizable monomers, such as maleic acid, itaconic acid, mesaconic acid, crotonic acid, acrylic acid or the esters thereof.

The graft polymers obtaine can be converted by hydrolysis, alcoholysis or transesterification into partially or completely saponified products, the degree of hydrolysis being at least about 1 mol%, preferably about 45 to 99 mol%, based on the mole number of saponifiable monomer units in the graft polymer. The production of graft polymers with a polyurethane graft backbone is described in DE 37 32 089.

The saponified graft polymers can be acetalized in an acidic medium by means of known methods.

Aliphatic aldehydes having 1 to 20 carbon atoms, which may be substituted, and aromatic aldehydes, which may also be substituted, are employed for acetalizing. Preference is given to aliphatic aldehydes having 1 to 5 carbon atoms, such as n-butyraldehyde, isobutyraldehyde, propionaldehyde or formaldehyde. Substituted or unsubstituted benzaldehydes, such as benzaldehyde, p-chlorobenzaldehyde or p-methoxybenzaldehyde are also suited. It is also possible to employ combinations of several of these aldehydes.

The degree of acetalization of the graft polyvinyl acetals used as binders in accordance with this invention is preferably selected such that the content of non-acetalized polyvinyl alcohol units in the graft polyvinyl acetals is greater than about 15 mol%, in particular about 18 to 60 mol%, and most preferably about 20 to 45 mol%, each time relative to the molar amount of vinyl alcohol units contained in the saponified graft polymers used, it being , possible for up to about 55 mol%, relative to the original amount, to be present as vinyl ester units. The hydroxyl number of the ready-for-use binder should be in the range of about 100 to 800.

The acetalization can be performed employing two different methods. In accordance with the first, the graft polymer is dissolved or dispersed in an alcohol or in a water/alcohol mixture, mixed with a catalytic amount of an organic or inorganic acid and an aldehyde or aldehyde mixture, and heated. The resulting polymer solution, which where appropriate also contains an anti-oxidant, can either be used directly for preparing the mixtures according to this invention, or alternatively, the polymer can be precipitated and purified by dropwise adding the solution to a non-solvent.

In accordance with the second process, the graft polymer is dissolved in water and mixed with an aldehyde or aldehyde mixture. Subsequently, an aqueous solution of an inorganic or strong organic acid—if appropriate with the addition of a surfactant and an antioxidant—is added dropwise at a low temperature. Thereby, the acetalized graft polymer is precipitated. The reaction is completed at an increased temperature of about 20° to 60° C. The isolated polymer is purified by washing with water or re-precipitation.

To prepare the graft polyvinyl acetals in an aqueous medium, known methods are employed to produce about 1 to 50% strength, preferably about 5 to 20% strength, aqueous solutions of the graft polyvinyl alcohols, preferably at elevated temperatures. The acid catalyst is added, the solutions are then cooled to temperatures of less than about 25° C., and the acetaliza reaction is finally performed by metering in the aldehyde with agitating, preferably within a time of 3 to 300 minutes. As is known, the aldehyde conversion is incomplete in most cases, and therefore an excess of aldehyde, preferably of about 10 to 20 mole percent, is usually added.

In a preferred process variant, the aqueous solution is allowed to stand for at least about 30 minutes at temperatures of about 0° to 5° C. prior to the start of the reaction, whereupon the graft polyvinyl acetal formed is generally separated off after a short time, as a pulverulent substance. To complete the reaction, the reaction mixture is slowly heated to room temperature, and where appropriate it is post-reacted at elevated temperatures, for example at about 25° to 70° C., during about one to three hours. The added amount of acid catalyst depends, inter alia, on the degree of acetalization to be achieved and may preferably be up to about 1.1 mole, relative to the molar content of vinyl alcohol units.

The resulting graft polyvinyl acetal is isolated by suction, washed with weakly alkaline water (pH 9 to 12) and dried. Acetalization products that do not precipitate from the aqueous reaction solution can be isolated by the addition of precipitating agents, purified and dried.

The acetalization can also be performed in organic solvents. Suitable solvents include water-miscible solvents, in particular water-soluble alcohols, such as ethanol and/or methanol, to which water may be added.

Preferred acid catalysts are organic sulfonic acids, for example, toluene sulfonic acids, and also mineral acids, for example sulfuric acid, phosphoric acid, hydrochloric acid or nitric acid. Among these, preference is given to phosphoric acid and hydrochloric acid.

For performing the preparation in organic solvents, the acid catalyst, the aldehyde and the graft polyvinyl alcohol are dispersed or dissolved in the solvent, and the mixture is refluxed. It may also be expedient to add the aldehyde in the course of the reaction. The graft polyvinyl alcohols which are insoluble in the organic solvents gradually dissolve as a consequence of the acetalization in progress.

When the acetalization reaction is completed, the reaction product is precipitated by adding non-polar solvents, for example, aliphatic hydrocarbons, or by pouring the reaction solution into ice-cold water or an ice-cold water/alcohol mixture, isolated by suction, washed with weakly alkaline water (pH 9 to 12), and dried.

The preparation of the graft polyvinyl acetals is also described in German Patent Application P 38 35 840.9.

In combination with diazonium salt polycondensation products or azido derivatives, the polymers obtained in this way result in layers which can be developed easily and without scumming. Depending on their individual composition, the layers can be developed with aqueous solutions of inorganic salts and/or surfactants or with aqueous-alkaline solutions. The layers are distinguished by a high abrasion resistance, good ink acceptance and adequate shelf lives and can therefore be used for numerous applications, in particular for producing planographic printing plates, screen printing stencils and photoresists.

Suitable diazonium salt polycondensation products are condensation products of condensible aromatic diazonium salts, for example, of diphenylamine-4-diazonium salts, with aldehydes, preferably with formaldehyde. It is particularly advantageous to use cocondensation products containing, in addition to the diazonium salt units A-N$_2$X, other, non-photosensitive units B which are derived from condensible compounds, particularly from aromatic amines, phenols, phenol ethers, aromatic thioethers, aromatic hydrocarbons, aromatic heterocyclic compounds and organic acid amines. These condensation products are described in DE 20 24 244. Generally, all diazonium salt polycondensation products described in DE 27 39 774 are suitable.

The diazonium salt units A-N$_2$X are preferably derived from compounds corresponding to the formula $$(R^1-R^2-)_p R^3-N_2.$$

in which
X is the anion of the diazonium compound,
p is an integer from 1 to 3,
R$^1$ is an aromatic radical which is capable, in at least one position, of condensation with an active carbonyl compound,
R$^3$ is an arylene group, preferably a phenylene group which may be substituted,
R$^2$ is a single bond or one of the groups:

—(CH$_2$)$_q$—NR$^4$—,

—O—(CH$_2$)$_r$—NR$^4$—,

—S—(CH$_2$)$_r$—NR$^4$—,

—S—CH$_2$CO—Nr$^4$—,

—O—R$^5$—O—,

—O—,

—S—, or

—CO—NR$^4$—, where
q is a number from 0 to 5,
r is a number from 2 to 5,
R$^4$ is a hydrogen atom, an alkyl group having from 1 to 5 carbon atoms, an aralkyl group having from 7 to 12 carbon atoms or an aryl group having from 6 to 12 carbon atoms, and
R$^5$ is an arylene group having from 6 to 12 carbon atoms.

Further advantageous polycondensation products are obtained by condensing an optionally-substituted diphenylamine diazonium salt first with an aromatic compound R'—O—CH$_2$—B and then with an aromatic compound R'—O—CH$_2$—B—CH$_2$—O—R', R' denoting a hydrogen atom, an alkyl radical or an aliphatic acyl radical, and B denoting the radical of any one of the condensible compounds listed above. These condensation products are described in detail in EP 126,875.

Low- or high-molecular weight azido derivatives are also suitable for use as photosensitive compounds for certain applications, preference being given to lowmolecu weight azido compounds having at least two azido groups per molecule. Examples of suitable compounds include 4,4'-diazidostilbenes, 4,4'-diazidobenzophenones, 4,4'-diazidobenzalacetophenones, 4,4'-diazidobenzalacetones and 4,4'-diazidobenzalcyclohexanones. Where appropriate, the photospeed of azido compounds of this type can be increased by adding suitable sensitizers, for example 1,2-benzanthraquinone. It is also possible to use polyfunctional azides whose absorption is shifted as a result of conjugation with double bonds in the molecule, so that no additional sensitization is required upon exposure. Further suitable azido compounds are described in GB 790,131, DE 950,618 and U.S. Pat. No. 2,848,328.

The mixtures according to the present invention generally comprise from about 5 to 90, preferably from about 10 to 70, percent by weight of photosensitive compound, and from about 90 to 10, preferably from about 75 to 20, percent by weight of graft polymer.

To stabilize the photosensitive mixture, it is advantageous to add a compound having an acidic character. Compounds which can be used include mineral acids and strong organic acids, with phosphoric acid, sulfuric acid, perchloric acid, boric acid or p-toluene sulfonic acid being preferred. Phosphoric acid is a particularly suitable acid.

Plasticizers, adhesion promoters and contrast-enhancing agents can also be added to the mixtures.

The types and quantities o such additions depend upon the field of application for which the photosensitive mixture is intended. In principle, care must be taken that the added substances do not absorb an excessive portion of the actinic light which is required for cross-linking, because this would result in a reduction of the practical sensitivity to light.

In addition, the photosensitive mixtures can contain dyes and/or pigments which may serve to enhance the contrast upon exposure and also to harden the layer. Suitable dyes are, for example, specified in U.S. Pat. No. 3,218,167 and U.S. Pat. No. 3,884,693. Particularly suitable are, for example, Victoria Pure Blue FGA, Victoria Pure Blue BO (C.I. 42,595), Malachite Green, Victoria Blue B (C.I. 44,045), Renol Blue B2G-H (C.I. 74,160), Crystal Violet, Fatty Red 5B (C.I. 26,125), Neozapon Blue FLE (C.I. Solvent Blue 70), Brilliant Blue Salt Acetate, Samarone Navy-Blue, Orasol Blue GN, Zapon Fast Fire-Red B (C.I. 13,900:1) or Rhodamine 6 GDN (C.I. 45,160). To enhance the image contrast after exposure, Metanil Yellow (C.I 13,065), Methyl Orange (C.I. 13,025) or phenylazodiphenylamine can be used.

For particular purposes it can be favorable to admix the photosensitive mixtures of the invention with further polymers in quantities of up to about 50 percent by weight, preferably up to about 20 percent by weight, relative to the above-described polymeric binders.

Within the scope of the present invention, the following weight proportions of the most important components of the photosensitive mixture are preferred, which are, in each case, based on the content of non-volatile constituents, i.e., the constituents of the solid photosensitive layer obtained after evaporation of the solvent:

| Binder: | 20 to 90% |
|---|---|
| photosensitive compound: | 10 to 70% |
| acid: | 0 to 10% |
| dye or pigment: | 0 to 12% |
| dye which changes its color upon exposure: | 0 to 5%. |

The support material is coated from appropriate organic solvents or solvent mixtures, generally by flow-coating, spraying or dipping. The coating method depends on the desired layer thickness, the dried layers usually having thicknesses between about 0.5 and 200 μm.

Suitable supports are, for example, magnesium, zinc, copper, mechanically, chemically and electrochemically grained aluminum, anodically oxidized aluminum, steel, and also polyester film or cellulose acetate film, Perlon gauze, etc., the surface of which may have been subjected to a pretreatment. The support material may function as the final support or as a temporary support material from which the photosensitive layer is transferred by lamination to the workpiece to be processed.

The recording material which is prepared using the photosensitive mixtures of the invention serves, on the one hand, to produce images on suitable supports or receptor sheets and, on the other hand to produce reliefs which are used as printing plates, screens, resists, and the like.

In addition, it is also possible to use the photosensitive mixtures for the formulation of UV-hardenable printing inks or for the preparation of lacquers which are hardenable by ultraviolet radiation and may be used for the protection of surfaces.

Primarily, the compositions are used for the production of lithographic printing plates, in which aluminum is the preferred support material. It is particularly preferred to pretreat the aluminum used for this purpose in the usual manner, for example, by a mechanical, chemical or electrochemical graining process which is optionally followed by an anodic oxidation. A further treatment of this support material, for example, with polyvinyl phosphonic acid, alkali metal silicate, phosphate, hexafluorozirconate, chromate, borate, polyacrylamide and cellulose derivatives is advantageous.

The recording materials obtained from the mixtures are processed in the conventional manner, by exposing imagewise and washing-out the unexposed areas of the layer with a suitable developer.

The recording material is exposed under an original, as is known in the art, using light sources which emit light with the highest possible spectral fraction in the near ultraviolet region The material can also be exposed by laser irradiation. Suitable lasers for irradiation are shorter-wave lasers of adequate performance, for example, Ar lasers, krypton ion lasers, helium/cadmium lasers, emitting in the region between about 300 and 600 nm and, for some layers, even CO2 lasers, which emit at about 10.6 μm, or YAG lasers emitting at about 1.06 μm.

As the developer solutions, water or neutral or alkaline aqueous solutions are used, which have a pH value in the range from about 6 to 14, preferably from about 7.5 to 12, and which contain buffer salts, for example, water-soluble alkali metal phosphates, alkali metal silicates, alkali metal borates, alkali metal carbonates, alkali metal acetates or alkali metal benzoates. Additional constituents used are wetting agents, preferably anionic wetting agents and, if appropriate, water-soluble polymers. The solution can also contain minor amounts, for example, up to about 5 percent by weight, preferably not more than about 2 percent by weight, of water-miscible organic solvents. Solvents that are difficultly volatile are preferred, for example, araliphatic alcohols, the vapor pressure of which is of no consequence in the handling of the developer. Development can be performed in the conventional manner by dipping, spraying, brushing or wiping-over with a pad. If desired, the developed material can be treated with a gumming solution.

The photosensitive recording materials of this invention are distinguished by good reproduction properties and an adequate shelf life. They can be easily developed without scum, using developer solutions which from an ecological point of view are virtually neutral.

The large print runs and the good ink acceptance obtained with printing forms prepared using the material of the present invention are particularly advantageous. The printing stencils are also highly resistant to alkaline developers and other processing solutions.

The preparation of the polyvinyl acetals used in the Examples is described below.

a) PREPARATION OF POLYURETHANE GRAFT BACKBONES

In each case, the diol component and the catalyst were first introduced into a reaction vessel equipped with a stirrer and supplied with a nitrogen atmosphere, and the mixture was heated to a reaction temperature of between 65° C. and 100° C. Then the diisocyanate component was metered in, with care being taken to ensure that the temperature of the reaction mixture did not exceed 120° C., and preferably did not exceed 100° C. After the complete addition of the diisocyanate component, the mixture was post-heated to a temperature between 80° C. and 100° C. for a period of up to two hours in order to complete the reaction. The completion of the conversion, and thus the end of the reaction, were determined by an analysis of the diisocyanate consumption with the aid of known methods (p.e., IR-spectroscopy, titration).

The detailed composition of the reaction mixtures used in the Examples and the calculated mean molecular weights ($\overline{M}_{calc}$) of the resulting polyurethanes (PU) are compiled in Table 1 below. The molecular weights result from the molar ratio diol component/diisocyanate, assuming a complete conversion of the NCO groups.

TABLE 1

| Poly-urethane (PU) | Diol component PEG/PU (molar ratio) | Reaction temperature (°C.) | Molar ratio diol component/ diisocyanate | $\overline{M}_{calc}$ |
|---|---|---|---|---|
| A | 7:3 | 80 | 1:0.9 | 6,470 |
| B | 7:3 | 72 | 1:0.9 | 6,470 |
| C | 3:2 | 78 | 1:0.97 | 18,300 |
| D | 7:3 | 75 | 1:0.97 | 19,900 |
| E | 7:3 | 78 | 1:0.95 | 13,200 |

PEG = Polyethylene glycol, molecular weight 600
Bu = 1,4-butanediol

All products were prepared using isophorone diisocyanate as the diisocyanate component. In each case, 1,4-dimethylpiperazine was used as the catalyst in an amount of 0 48 mol%, relative to the diisocyanate.

b) PREPARATION OF THE GRAFT POLYMERS

In each case, the polyurethane graft backbone was melted in a reaction vessel in a nitrogen atmosphere or was dissolved, respectively, by adding small amounts of methanol, and heated to a temperature between 60° C. and 100° C. The monomers to be grafted on, which had optionally been dissolved in a solvent, e.g., methanol, including the free-radical initiator dissolved in the monomer, were then slowly metered to the polyurethane graft backbone, such that homopolymer formation was largely suppressed.

The maximum temperature of the reaction mixture should be 120° C., more preferably 100° C.

When the post-reaction was completed, excess monomer remainders were removed by azeotropic distillation with methanol. The compositions of the individual reaction mixtures and the reaction parameters are compiled in Table 2 below.

TABLE 2

| Graft polymer | PU | VAc g/g PU | Cr g/g PU | Start temp. °C. | Metering time min | Post- react. min | Grafted-on monom. wt % | $J_o$ ml/g | calc. molecular weight |
|---|---|---|---|---|---|---|---|---|---|
| AV | A | 4 | 0 | 75 | 420 | 45 | 79.8 | 21.9 | 31,300 |
| BV | B | 2.32 | 0 | 73 | 420 | 45 | 69.3 | 18.3 | 21,000 |
| CV | C | 3.16 | 0 | 75 | 300 | 45 | 74.7 | 26.3 | 72,500 |
| DV | D | 3.16 | 0 | 75 | 420 | 45 | 74.5 | 28.7 | 78,000 |
| EVCr | E | 3.13 | 0.027 | 75 | 300 | 45 | 75.1 | 30.5 | 53,000 |
| EVCr' | E | 3.03 | 0.126 | 75 | 300 | 45 | 75.3 | 31.5 | 53,000 |

VAc = Vinyl acetate
Jo = intrinsic viscosity
Cr = Crotonic acid

All products were prepared employing 0.2 mol% of dibenzoyl peroxide (relative to the monomer used in each case). The intrinsic viscosities were determined at 25 C in tetrahydrofuran, using an Ostwald Viscosimeter, with the measured concentrations being selected such that a Hagenbach correction was not necessary. The grafted-on amount of monomer, in % by weight, is related to the weight of the total polymer.

c) SAPONIFICATION OF THE GRAFT POLYMERS

The graft polymers of Table 2 were transesterified or saponified within two hours at room temperature. For this purpose, the products were dissolved in methanol to give 50 % strength solutions and mixed with methanolic soda lye (10% strength). Depending on the added amount of alkali and the degree of grafting of the graft polymer, polymeric hydrolysis products having different degrees of hydrolysis were obtained. Partial saponifications were performed with the co-use of water. The resulting gels were granulated using conventional mills, the granules were washed with methanol (where appropriate with an addition of acetic acid to neutralize the soda lye) and dried. The process parameters and results are compiled in Table 3 below.

TABLE 3

| Graft polyvinyl alcohol | Graft polyvinyl acetate | mole % of NaOH per ester unit | mole % of H₂O per ester unit | Degree of hydrolysis in % | $M_{calc}$ |
|---|---|---|---|---|---|
| F | AV | 1.92 | 0 | 98.2 | 22,000 |
| G | BV | 5.00 | 0 | 98.9 | 14,000 |
| H | CV | 1.92 | 0 | 98.0 | 47,000 |
| I | DV | 1.97 | 0 | 98.4 | 44,000 |
| K | CV | 0.56 | 12.53 | 60.0 | 56,600 |
| L | CV | 0.50 | 11.13 | 56.5 | 57,600 |
| M | EVCr | 1.59 | 0 | 92.7* | 40,000 |
| N | EVCr' | 2.00 | 0 | 94.5* | 36,000 |

*found by determination of the acid present following saponification; the crotonic acid present in the polymer is also measured.

d) PREPARATION OF THE GRAFT POLYVINYL ACETALS

The graft polymers listed in Table 3 were dissolved in about eight times their amount of distilled water. The corresponding amount of aldehyde and a small amount of 2,6-di-tert.-butyl-4-methylphenol were added at room temperature. A solution comprising a small amount of sodium octyl sulfate, ⅓ of the weight amount of the aldehyde of concentrated hydrochloric acid and water was dropwise added to this solution, with agitating. The mixture was stirred for one hour at room temperature, then heated to 40° C., and stirring was continued for another two hours. Thereafter concentrated hydrochloric acid (the same weight amount as the aldehyde) was added and stirring was continued at 40° C. for a further two hours. When the mixture had cooled down to room temperature the aqueous phase was decanted from the precipitated polymer, the polymer was dissolved in ethanol and precipitated by pouring it into an excess amount of water. The polymer was dried in a vacuum drier at 40° C. until its weight remained constant.

TABLE 4

| Graft polyvinyl acetal | Graft polyvinyl alcohol | Aldehyde | OH number |
|---|---|---|---|
| O | F | Bu | 370 |
| P | G | Bu | 290 |
| Q | H | Pr | 336 |
| R | K | Bu | 124 |
| S | H | Ac + Bu 1) | 144 |
| T | H | Bz + Pr 2) | 328 |
| U | H | Bz | 393 |
| V | H | Bu | 201 |
| W | M | Pr | 401 |
| X | N | Bu | 351 |

Bu = n-butyraldehyde
Ac = acetaldehyde
Bz = benzaldehyde
Pr = propionaldehyde
1) Molar ratio 4.6:1
2) Molar ratio 1:1

Preferred embodiments of the invention are described in the Examples which follow. In most cases, amounts are indicated in parts by weight (pbw). Unless otherwise specified, percentages and proportions are given in weight units.

EXAMPLE 1

A coating solution comprised of

| 2.600 | pbw | of polymer I, |
| 2.600 | pbw | of a diazonium salt poly-condensation product prepared from 1 mole of 3-methoxy-diphenylamine-4-diazonium sulfate and 1 mole of 4,4'-bis-methoxy-methyl-diphenylether, isolated as methane sulfonate, |
| 0.117 | pbw | of phosphoric acid (85% strength) and |
| 0.340 | pbw | of Basonyl Red 540 (C.I. 45,170), in |
| 160.000 | pbw | of distilled water | is applied to a 0.3 mm thick aluminum foil which has been electrochemically grained in nitric acid, anodically-oxidized in sulfuric acid and post-treated with a 0.1% strength aqueous solution of polyvinyl phosphoic acid. Application is performed such that a dry layer weight of 0.52 g/m² results.

The photosensitive layer obtained in this way is exposed for 36 seconds through a standard test original by means of a 5 kW metal halide lamp. The exposed layer exhibits a clear contrast between the exposed and unexposed areas and is developed by spraying with a jet of water, whereby the non-exposed layer portions are completely removed within a short time. The plate is subsequently dried. The copy reproduces even the finest elements of the original.

EXAMPLE 2

A coating solution comprised of

| | | |
|---|---|---|
| 2.500 | pbw | of polymer O, |
| 2.860 | pbw | of a diazonium salt polycondensation product prepared from 1 mole of 3-methoxy-diphenylamine-4-diazonium sulfate and 1 mole of 4,4'-bis-methoxy-methyl-diphenylether, isolated as mesitylene sulfonate, |
| 0.100 | pbw | of phosphoric acid (85% strength) and |
| 0.028 | pbw | of phenylazodiphenylamine and |
| 0.130 | pbw | of Victoria Pure Blue FGA (C.I. Basic Blue 81), in |
| 22.900 | pbw | of tetrahydrofuran and |
| 118.000 | pbw | of 2-methoxyethanol | is applied to an aluminum foil pretreated as described in Example 1, such that the dried layer has a weight of 1.0 g/m². The layer is exposed for 30 seconds as described in Example 1. Development is performed with a developer solution having the following composition:

| | | |
|---|---|---|
| 5.0 | pbw | of sodium octyl sulfate, |
| 1.0 | pbw | of sodium metasilicate × 5 H₂O, and |
| 94.0 | pbw | of distilled water. |

The non-exposed layer areas are removed within a short time without remainders being left behind. The plate is then rinsed with water and dried. Even the finest image elements of the original are reproduced on the copy. More than 200,000 prints can be run in a sheet-fad offset press with the printing plate produced in this way.

EXAMPLE 3

A coating solution comprised of

| | | |
|---|---|---|
| 3.40 | pbw | of polymer P, |
| 1.10 | pbw | of the diazonium salt polycondensation product described in Example 2, |
| 0.050 | pbw | of phosphoric acid (85% strength), |
| 0.11 | pbw | of Metanil Yellow (C.I. 13,065) and |
| 0.15 | pbw | of Victoria Blue B (C.I. 44,045), in |
| 160.00 | pbw | of 2-methoxyethanol | is applied in an aluminum foil pretreated as described in Example 1, such that the dried layer has a weight of 0.9 g/m². The layer is exposed for 30 seconds as described in Example 2. Development is performed with a developer solution having the following composition:

| | | |
|---|---|---|
| 5.0 | pbw | of sodium octyl sulfate, |
| 1.5 | pbw | of sodium metasilicate × 5 H₂O, |
| 1.5 | pbw | of trisodium phosphate × x 12 H₂O, and |
| 92.0 | pbw | of distilled water. |

The non-exposed layer areas are instantaneously removed. Even the finest image elements of the original are reproduced on the copy. More than 250,000 prints can be run in a sheet-fad press machine with the printing plate produced in this way.

EXAMPLE 4

A coating solution comprised of

| | | |
|---|---|---|
| 3.60 | pbw | of polymer L, |
| 1.80 | pbw | of the diazonium salt polycondensation product described in Example 2, |
| 0.20 | pbw | of phosphoric acid (85% strength), |
| 0.10 | pbw | of Crystal Violet (C.I. 42,555) and |
| 0.06 | pbw | of phenylazodiphenylamine, in |
| 150.00 | pbw | of 2-methoxyethanol, | is applied to an aluminum foil pretreated as in Example 1, in a way such that a dry layer weight of 1.2 g/m² is obtained.

After an exposure time of 15 seconds the layer is developed by wiping it with a plush dabber, using a developer solution having the following composition:

| | | |
|---|---|---|
| 5.0 | pbw | of sodium octyl sulfate, |
| 1.0 | pbw | of sodium metasilicate × 5 H₂O, |
| 1.0 | pbw | of trisodium phosphate × 12 H₂O, |
| 0.5 | pbw | of disodium hydrogen phosphate × 1 H₂O, and |
| 92.0 | pbw | of water. |

The non-exposed layer areas are completely removed. Subsequently, the plate is rinsed with water and dried.

On the copy, a solid step 4 is obtained of a silver film continuous-tone step wedge having a density range of 0.15 to 1.50 with increments of 0.15. The plate thus produced gives 220,000 prints in a sheet-fed offset press.

EXAMPLE 5

A coating solution comprised of

| | | |
|---|---|---|
| 2.500 | pbw | of polymer R, |
| 2.500 | pbw | of the diazonium salt polycondensation product described in Example 2, |
| 0.118 | pbw | of phosphoric acid (85% strength), |
| 0.045 | pbw | of phenylazodiphenylamine and |
| 0.100 | pbw | of Crystal Violet, in |
| 160.000 | pbw | of 2-methoxymethanol | is applied to the aluminum support described in Example 1, such that a dry layer weight of 1.0 g/m² is obtained. The plate obtained following exposure and development as described in Example 2 gives several thousands of quality prints.

EXAMPLE 6

A coating solution comprised of

| | | |
|---|---|---|
| 1.300 | pbw | of polymer Q, |
| 1.300 | pbw | of the diazonium salt polycondensation poduct described in Example 2, |
| 0.059 | pbw | of phosphoric acid (85% strength), |

-continued

| | |
|---|---|
| 0.023 | pbw of phenylazodiphenylamine and |
| 0.340 | pbw of Renol Blue B2G-H (C.I. 74,160), in |
| 90.000 | pbw of 2-methoxyethanol | is applied to the support material described in Example 1, such that a dry layer weight of 1.1 g/m² is obtained. After exposure and development as described in Example 2, a copy of the original is obtained where step 4 of the continuous-tone step wedge (cf. Example 4) is solid. The printing plate gives 240,000 prints on a sheet-fed offset press.

EXAMPLE 7

Instead of the polymer Q, the binder S is employed for preparing a coating solution as in Example 6.

This coating solution is applied onto an aluminum foil pretreated as in Example 1, and dried. The dry layer weight is about 1 g/m².

The photosensitive layer is exposed through a negative original for 30 seconds, using the lamp described in Example 1, and is then developed with the developer specified in Example 3.

The layer is rubbed with a plush dabber, and after a few seconds, the non-image areas of the copying layer dissolve away, and the plate is thereafter rinsed with water and dried. The copy has the same quality as the copy of Example 3. In a sheet-fed offset press, the plate gives 210,000 good prints.

EXAMPLE 8

A coating solution is prepared as described in Example 6, with the exception that polymer T is employed. Processing is the same as in Example 6. A high-resolution copy results after imagewise exposure (30 seconds) and development. When clamped in a sheet-fed offset press, the printing form obtained gives more than 200,000 high-quality prints.

EXAMPLE 9

A coating solution is prepared as described in Example 2, with the exception that polymer U is employed, and is applied to aluminum foil pretreated as described above such that a dry layer weight of 0.95 g/m² is obtained.

The layer is exposed for 30 seconds as described in Example 1. Development is performed with a developer solution of the following composition:

| | |
|---|---|
| 5.0 | pbw of sodium octyl sulfate, |
| 1.5 | pbw of sodium metasilicate × 5 H₂O, |
| 1.0 | pbw of trisodium phosphate × 12 H₂O, |
| 1.0 | pbw of phenoxyethanol, and |
| 91.5 | pbw of water. |

The non-image areas of the layer are readily dissolved away after wiping the plate with a plush pad for just a few seconds; the plate is then rinsed with water and dried. The resulting copy of the original exhibits a high resolution.

EXAMPLE 10

The shelf life of the layer described in Example 6 is tested. For this purpose, plates are prepared using the photosensitive mixture described in Example 6 and are stored at 100° C. in a drying oven for 1 to 4 hours. Subsequently, the plates are imagewise exposed and developed with the developer solution of Example 2. To render visible any layer residues (toning) remaining in the non-image areas, the dried plates are dyed with a protective ink. The plates stored in the oven for 1 and 2 hours can be developed satisfactorily. They do not exhibit any extension of the continuous-tone step wedge. After a storage time of 3 hours, the continuous-tone step wedge is extended by half a step. Development is insignificantly retarded. The plate stored for 4 hours exhibits an increase of 1.5 step. Development is slightly retarded. These results show that the mixtures according to this invention have a relatively good resistance to storage in the heat.

EXAMPLE 11

A coating solution comprised of

| | |
|---|---|
| 1.10 | pbw of polymer V, |
| 1.10 | pbw of 4,4′-diazido-stilbene-2,2′-disulfonic acid sodium salt, |
| 0.15 | pbw of Rhodamine 6 GDN extra (C.I. 45,160), and |
| 0.05 | pbw of Michler's ketone, in |
| 15.00 | pbw of tetrahydrofuran, |
| 10.00 | pbw of water and |
| 50.00 | pbw of 2-methoxyethanol | is applied to the support described in Example 1 such that a dry layer weight of 0.8 g/mz is obtained. The copying layer is exposed for 35 seconds through a negative original and then developed with pure water, whereby the non-image areas are removed within a short time.

EXAMPLES 12 TO 18

The Examples which follow are intended to illustrate that the photosensitive layers according to this invention can be more readily developed with aqueous developers than layers containing customary, commercially-available polyvinyl acetals, and that at the same time the copying and printing behavior of the plates according to this invention is as good as or superior to that of the plates employed in the Comparative Examples (C). For this purpose, six coating solutions are prepared which only differ in the polymer employed:

| | |
|---|---|
| 3.60 | pbw of the respective polymer, |
| 1.80 | pbw of the diazonium salt polycondensation product of Example 2, |
| 0.20 | pbw of phosphoric acid (85% strength), |
| 0.10 | pbw of Crystal Violet (C.I 42,555) and |
| 0.06 | pbw of phenylazodiphenylamine, in |
| 150.00 | pbw of 2-methoxyethanol. |

The polymers employed in the individual Examples, their OH numbers as well as the developability, resolution, ink acceptance and print run of the individual photosensitive layers are specified in Table 5 below. All layers have a dry weight of 1.0 g/m². They are applied to supports comprising aluminum which has been electrolytically grained in nitric acid, anodically oxidized and post-treated with polyvinyl phosphoric acid.

TABLE 5

| Example | 12 | 13 | 14 | 15(C) | (16(C) | 17(C) | 18(C) |
|---|---|---|---|---|---|---|---|
| Polymer | O | L | Q | But | But | But | For |
| Molecular weight | 30,400 | 57,600 | 62,300 | 85,000 | 85,000 | 85,000 | 30,000 |
| OH-number | 370 | 347 | 336 | 300 | 220 | 160 | 85 |
| Developer | | | | | | | |
| (a) | + | + | + | − | − | − | − |
| (b) | + | + | + | − | − | − | − |
| (c) | + | (+) | (+) | (+) | − | − | + |
| (d) | + | + | + | − | − | − | − |
| (e) | (+) | (+) | (+) | + | + | (+) | (+) |
| Ink acceptance | good | good | good | good | good | good | good |
| Print run | 200,000 | 220,000 | 240,000 | 120,000 | 120,000 | 120,000 | 220,000 |

But = commercially available polyvinyl butyrals
For = commercially available polyvinyl formal
+ = developer well suited
− = developer not suited, since no layer differentiation
(+) = developer not very well suited, since poor layer differentiation or attack on exposed layer areas Composition of the developers:

| | | |
|---|---|---|
| (a) | Developer of Example 2 | |
| (b) | 0.2 pbw | of sodium metasilicate × 9 H$_2$O, |
| | 4.0 pbw | of disodium hydrogen phosphate × 12 H$_2$O, |
| | 3.5 pbw | of trisodium phosphate × 12 H$_2$O, |
| | 1.5 pbw | of potassium tetraborate × 4 H$_2$O, |
| | 2.0 pbw | of potassium oxalate × 1 H$_2$O, |
| | 88.8 pbw | of water |
| (c) | 1.0 pbw | of sodium tetraborate × 4 H$_2$O, |
| | 2.0 pbw | of sodium octylsulfate, |
| | 15.0 pbw | of sodium salicylate, |
| | 2.5 pbw | of sodium benzoate, |
| | 5.0 pbw | of trisodium citrate × 2 H$_2$O, |
| | 1.0 pbw | of phenoxyethanol, |
| | 73.5 pbw | of water |
| (d) | 1.0 pbw | of NaOH, |
| | 4.0 pbw | of pelargonic acid, |
| | 12.0 pbw | of ethylene oxide/propylene oxide copolymer, |
| | 4 pbw | of sodium tetrapolyphosphate, |
| | 79 pbw | of water |
| (e) | 0.5 pbw | of ethylene carbonate, |
| | 15.0 pbw | of 2-hydroxyethylacetate, |
| | 10.0 pbw | of glycerol, |
| | 1.0 pbw | of sodium benzoate, |
| | 0.5 pbw | of benzoid acid |
| | 50.0 pbw | of propylene glycol monomethyl ether, |
| | 23.0 pbw | of water. |

These Examples show that the photosensitive mixtures according to this invention can be easily developed with aqueous solutions, whereas this is not the case with the mixtures used in the Comparative Examples. The latter can only be processed with solvent-containing developers.

EXAMPLE 19

A coating solution is prepared from

| | | |
|---|---|---|
| 1.1 | pbw | of polymer I |
| 1.1 | pbw | of 4,4'-diazidostilbene-2,2'-disulfonic acid disodium salt, |
| 0.15 | pbw | of Basonyl Red 540 and |
| 0.05 | pbw | of Michler's ketone, in |
| 50.00 | pbw | of methanol and |
| 50.00 | pbw | of water | and applied onto an aluminum support grained by means of a wire brush, in a way such that a dry layer weight of 0.9 g/m$^2$ is obtained. The layer is exposed for 35 seconds and developed by spraying with pure water.

EXAMPLE 20

A coating solution is prepared as described in Example 2, with the exception that the polymer W is employed as the binder, and is spin-coated onto the support material described in Example 1. The dried layer has a weight of 0.96 g/m$^2$. The photosensitive layer is exposed for 30 seconds through a standard negative original, and thereafter the unexposed areas are instantly removed with the developer solution of Example 3. The resulting printing plate is distinguished by excellent resolution and ink acceptance.

EXAMPLE 21

A coating solution is prepared as described in Example 1, with the exception that the polymer X is employed as the binder, and is spin-coated onto the support material described in Example 1. The dried layer has a weight of 1.1 g/m$^2$. The exposed layer is immediately developed by spraying with pure water. A high-resolution printing plate is obtained.

What is claimed is:

1. A photocurable mixture, comprising:
   from about 5 to 90 percent by weight of a photosensitive compound selected from the group consisting of a diazonium salt polycondensation product and an organic azido compound; and
   from about 90 to 10 percent by weight of a binder comprising a high-molecular weight polymer having vinyl alcohol units, wherein said polymer is a graft polymer comprising a polyurethane graft backbone onto which chains containing vinyl alcohol units and vinyl acetal units are grafted
   wherein the polyurethane is a polyaddition product obtained from diisocyanates and diols.

2. The photocurable mixture as claimed in claim 1, wherein the grafted-on chains additionally contain vinyl ester units.

3. The photocurable mixture as claimed in claim 1, wherein vinyl acetal units are derived from an aliphatic or cycloaliphatic aldehyde.

4. The photocurable mixture as claimed in claim 3, wherein the grafted-on chains additionally contain units of other ethylenically unsaturated monomers which are copolymerizable with vinyl esters.

5. The photocurable mixture as claimed in claim 1, wherein the grafted-on chains additionally contain units of other ethylenically unsaturated monomers which are copolymerizable with vinyl esters.

6. The photocurable mixture as claimed in claim 1, wherein the diol is an aliphatic diol having 2 to 12 carbon atoms, a cycloaliphatic diol having 5 to 10 carbon atoms or an aliphatic polydiol having a molecular weight between 200 and 10,000.

7. The photocurable mixture as claimed in claim 6, wherein the diol is a mixture comprising 1 mol of polydiol and 0.1 to 0.7 mol of low molecular weight aliphatic diol.

8. The photocurable mixture as claimed in claim 1, wherein the diisocyanate is an aliphatic diisocyanate having 4 to 15 carbon atoms or a cycloaliphatic diisocyanate having 7 to 15 carbon atoms.

9. The photocurable mixture as claimed in claim 1, wherein the polyurethane has a molecular weight between 200 and 100,000.

10. The photocurable mixture as claimed in claim 1, wherein the diazonium salt polycondensation product comprises recurrent units A-N$_2$X and B, which are linked by intermediate members derived from condensible carbonyl compounds, with A being the radical of an aromatic diazonium compound which is capable of condensation with formaldehyde and B being the radical of a compound which is free of diazonium groups and is capable of condensation with formaldehyde.

11. The photocurable mixture as claimed in claim 10, wherein the units A-N$_2$X are derived from compounds of the general formula $$(R^1\text{-}R^2\text{---})_p R^3\text{-}N_xX.$$

in which
X is the anion of the diazonium compound,
p is an integer from 1 to 3,
$R^1$ is an aromatic radical which is capable, in at least one position, of condensation with an active carbonyl compound,
$R^3$ is a phenylene group,
$R^2$ is a single bond or one of the groups:

—(CH$_2$)$_q$—NR$^4$—,

—O—(CH$_2$)$_r$—NR$^4$—,

—S—(CH$_2$)$_r$—NR$^4$—,

—S—CH$_2$CO—Nr$^4$—,

—O—R$^5$—O—,

—O—,

—S—, or

—CO—NR$^4$—, where
q is a number from 0 to 5,
r is a number from 2 to 5,
$R^4$ is a hydrogen atom, an alkyl group having from 1 to 5 carbon atoms, an aralkyl group having from 7 to 12 carbon atoms or an aryl group having from 6 to 12 carbon atoms, and
$R^5$ is an arylene group having from 6 to 12 carbon atoms.

12. The photocurable mixture as claimed in claim 10, wherein B is the radical of an aromatic amine, a phenol, a phenol ether, an aromatic thioether, an aromatic hydrocarbon, an aromatic heterocyclic compound or an organic acid amide.

13. A photocurable mixture as claimed in claim 10, wherein A is a methylene radical.

14. The photocurable mixture as claimed in claim 1, wherein the organic azido compound includes at least two azido groups in its molecule.

15. The photocurable mixture as claimed in claim 1, consisting essentially of the photosensitive compound and the polyurethane binder having grafted vinyl alcohol units and vinyl acetal units.

16. A photocurable recording material comprising a layer support and a photosensitive layer, wherein the photosensitive layer comprises a mixture as claimed in claim 1.

* * * * *